United States Patent [19]
Otsubo et al.

[11] 4,004,953
[45] Jan. 25, 1977

[54] METHOD FOR GROWING CRYSTALS OF III-V COMPOUND SEMICONDUCTORS

[75] Inventors: Mutsuyuki Otsubo; Hidejiro Miki; Kiyoshi Shirahata, all of Amagasaki, Japan

[73] Assignee: Mitsubishi Denki Kabushiki Kaisha, Japan

[22] Filed: Sept. 23, 1975

[21] Appl. No.: 615,882

[30] Foreign Application Priority Data
Oct. 7, 1974  Japan ............................ 49-115367

[52] U.S. Cl. .............................. 148/172; 148/171; 252/62.3 GA
[51] Int. Cl.$^2$ ...................................... H01L 21/208
[58] Field of Search ........................... 148/171, 172; 252/62.3 GA

[56] References Cited
UNITED STATES PATENTS 3,344,071  9/1967  Cronin ........................... 148/172 X
3,713,900  1/1973  Suzuki ........................... 148/171 X Primary Examiner—G. Ozaki
Attorney, Agent, or Firm—Wenderoth, Lind & Ponack

[57] ABSTRACT

This invention relates to a method for growing semi-insulating III–V compound semiconductor crystals on a substrate by means of an epitaxially crystallizing process in the liquid state, which comprises the steps of:

a. placing a saturated solution of a III–V compound in a reaction tube, b. carrying out a heating of the solution in the atmosphere of a $H_2$ gas, and c. growing a crystal of the III–V compound on the substrate in the liquid phase at a temperature below the melting point of the III–V compound while keeping the vapor pressure of the V Group element under a predetermined value in the reaction tube.

6 Claims, 4 Drawing Figures

AMOUNT OF PARTICULATE CHROMIUM IN GALLIUM SOLUTION

AMOUNT OF PARTICULATE CHROMIUM IN GALLIUM SOLUTION

METHOD FOR GROWING CRYSTALS OF III-V COMPOUND SEMICONDUCTORS

BACKGROUND OF THE INVENTION

This invention relates to a method for growing semi-insulating III-V compound semiconductor crystals by means of an epitaxially crystallizing process in the liquid state.

Generally, the liquid phase method for growing a crystal of a III-V compound semiconductor provides a higher quality crystal in a convenient manner in a relatively simple apparatus as compared with the gas phase method, and according to the former method, it is relatively easy to control the carrier concentration regardless of conduction type. For this reason, heretofore, the liquid phase method has been used to epitaxially grow crystals for Gunn diodes, IMPATT diodes, Schottky diodes, light emitting diodes, and laser diode semiconductors. However, according to the conventional liquid phase growing method, it has been impossible to obtain a crystal of a semi-insulating III-V compound semiconductor.

On the other hand, it is known from Japenese Pat. Publication No. 14,964/67 that a semi-insulating crystal having a resistivity of $10^6 - 10^8$ ohm-cm can be obtained by the addition of chromium in growing a crystal of a III-V compound semiconductor by means of the Bridgman Method and the liquid encapsulation method. Nowadays, a semi-insulating bulk crystal is produced on an industrial scale by the addition of chromium.

In connection with the development of planarizing and integrating techniques, an epitaxially growing method has widely been used, and the liquid phase growing of chromium-doped semi-insulative III-V compound semiconductors has been tried. However, according to the conventional liquid phase growing method with the addition of chromium, it was impossible to obtain an epitaxial crystal of a semi-insulating III-V compound semiconductor having a high resistivity. Only a crystal having a low resistivity could be obtained (see "Material Research Bulletin" Vol. 4, pp. 149 - 152, 1969).

We have found as a result of the study for the liquid phase growing of chromium-doped semi-insulating III-V compound semiconductors that a semi-insulating III-V compound semiconductor having a desired resistivity can be obtained by reducing the concentration of residual free electrons and choosing an appropriate growing temperature.

DESCRIPTION OF THE PRIOR ART

The accompanying drawing, FIG. 1, shows a sectional view of a horizontal type inclined furnace which is used to prepare crystals of III-V compound semiconductors in accordance with the conventional method. In FIG. 1, there is shown a furnace 1, which embraces a reaction tube, 2, made of quartz. In the reaction tube, there is placed a boat, 3, made of high purity carbon. On the boat, 3, there are placed a saturated solution of gallium arsenide, 4, and a substrate, 5, on which a crystal is epitaxially grown. The boat, 3, having the saturated solution, 4, and the substrate, 5, thereon is inserted in the inclined reaction tube, 2, heated at a predetermined temperature, as shown in FIG. 1, and is kept still without the substrate, 5, contacting the saturated solution, 4. After the temperature in the reaction tube is restored to the predetermined temperature, the inclination of the furnace, 1, is reversed so that the saturated solution, 4, can come into contact with the substrate, 5. After keeping this state for a few minutes, the furnace, 1, is cooled to grow a crystal epitaxially on the substrate, 5. In this case, if a saturated solution of gallium arsenide is used as it is, without any treatment, only an epitaxial crystal having a high concentration of residual free electrons can be obtained. In order to obtain a semi-insulating crystal, the concentration of the residual free electrons must be lowered. For this purpose, a heating of the saturated solution has been tried in an atmosphere of highly pure hydrogen. By treating the saturated solution in the above manner, the concentration of residual free electrons could temporarily be lowered. However, it is difficult to constantly reproduce an epitaxial crystal having a residual free electrons concentration of less than $10^{13}$ cm$^{-3}$ by means of this method only.

SUMMARY OF THE INVENTION

An object of this invention is to provide a method for producing a semi-insulating III-V compound semiconductor crystal by means of an epitaxially crystallizing process in the liquid phase.

Another object of this invention is to provide a method for producing a chromium-doped semi-insulating III-V compound semiconductor crystal by means of an epitaxially crystallizing process in a liquid phase.

A further object of this invention is to provide a method for producing a semi-insulating III-V compound semiconductor crystal having a residual free electron concentration of less than $10^{13}$ cm$^{-3}$ by means of an epitaxially crystallizing process in the liquid phase.

A still further object of this invention is to provide a method for producing a semi-insulating III-V compound semiconductor crystal having a high resistivity of the order of $10^7$ ohm-cm by means of an epitaxially crystallizing process in the liquid phase.

A still further object of this invention is to provide a method for producing a chromium-doped semi-insulating III-V compound semiconductor crystal of constant reproducibility by means of an epitaxially crystallizing process in the liquid phase.

DESCRIPTION OF THE PREFERRED EMBODIMENTS

The preferred embodiments of this invention are explained hereinafter referring to FIG. 2.

Figure 1:
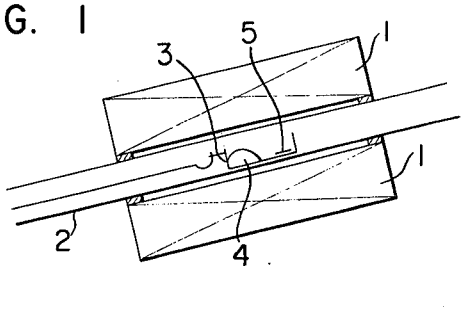
FIG. 1 shows a sectional view of a horizontal type inclined furnace which is used to prepare III-V compound semiconductor crystals in accordance with the conventional method.
Figure 2:
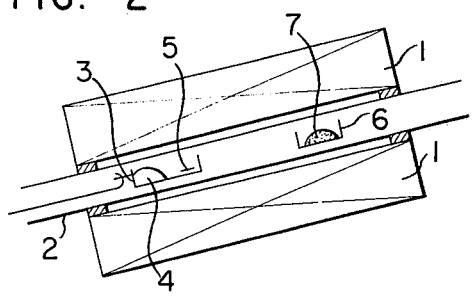
FIG. 2 shows a sectional view of a horizontal type inclined furnace equipped with a boat containing arsenic vapor generating material, which is used to prepare III-V compound semiconductor crystals in accordance with the present invention.

In FIG. 2, there is shown a heater, 1, which embraces a reaction tube, 2, made of quartz. In the reaction tube, there are placed boats, 3, and 6, both made of high purity carbon. On boat, 3, there are placed a gallium solution, 4, containing arsenide and a substrate, 5, of chromium-doped bulk crystal having a plane orientation <100>. On boat, 6, there is placed an arsenic vapor generating source, 7, to control the arsenic vapor pressure.

The gallium solution, 4, was employed after being saturated with gallium arsenide, GaAs, and treated with hydrogen.

The arsenic vapor pressure in the reaction chamber, 2, is controlled by placing the arsenic vapor generating source on boat, 6, and suitably varying the temperature. A gallium solution containing arsenide can be used as the arsenic vapor generating source.

We have found that an epitaxial crystal having a residual free electron concentration of less than $10^{13}$ cm$^{-3}$ can be obtained with excellent reproducibility by suitably combining a step of heating a saturated solution, 4, of gallium arsenide with a step of controlling the arsenic vapor pressure in the reaction, tube 2.

At first, boat, 3, on which a gallium solution, 4, saturated with gallium arsenide is placed, is inserted in the quartz reaction tube, 2, and the solution, 4, is subjected to heating at a temperature of 800°– 950° C by raising the temperature of the furnace, 1, in a stream of hydrogen. The heating is usually carried out for 1 or 2 hours per gram of gallium.

Thereafter, a substrate, 5, is placed on boat, 3, and boat, 6, having an arsenic vapor generating source, 7, thereon is inserted in the reaction tube, 2. The temperature of the furnace is then raised again to a predetermined temperature, usually up to 700°– 900° C in an atmosphere of hydrogen gas while keeping the arsenic vapor pressure under a predetermined value. The arsenic vapor pressure is usually maintained at $3 \times 10^{-3} - 2 \times 10^{-2}$ atm at a temperature of 700°– 900° C, for example $7 \times 10^{-3}$ atm at 800° C.

After keeping the furnace, 1, under the above conditions for a predetermined time, for example 10 – 30 minutes, the inclination of the furnace is reversed so that the gallium solution, 4, can come into contact with the substrate, 5. After keeping the substrate in contact with the gallium solution under the above conditions for a suitable time (e.g., 5 – 15 minutes), the furnace is slowly cooled, for example at a cooling rate of 1° – 5° C/min. to grow an epitaxial crystal of gallium arsenide on the substrate, 5, at a temperature below the melting point of gallium arsenide. The growth of the crystal is usually carried out at a temperature of 700° – 900° C, while keeping the arsenic vapor pressure at $3 \times 10^{-3} - 2 \times 10^{-2}$ atm. The growth of the crystal can conveniently be stopped by taking the boat, 3, out of the furnace.

We have found that an epitaxial crystal of gallium arsenide having a high resistivity of the order of $10^7$ ohm-cm at room temperature can be obtained by adding chromium metal to the gallium solution, 4. This effect can be achieved by adding a small amount of particulate chromium metal (preferably up to 1 mol %) to the gallium solution, 4, before or after the heating of the gallium solution.

EXAMPLE 1

A solution containing 7 g of gallium (Ga), 350 mg of gallium arsenide (GaAs) and 20 – 30 mg of chromium (Cr) was heated for 7 – 8 hours at 900° C in an atmosphere of hydrogen. After the heating, the solution was cooled to room temperature, and then a substrate (base crystal) was placed in the same boat having the solution thereon, without contacting the solution, while inserting another boat having an arsenide generating source thereon in the reaction tube. The furnace was heated to 800° C, while controlling the arsenic vapor pressure at about $7 \times 10^{-3}$ atm. After keeping the furnace at this temperature for 20 minutes the inclination of the furnace was reversed so that the substrate could come into contact with the gallium solution. The substrate was kept in contact with the solution at this temperature for 10 minutes, and then the furnace was gradually cooled to grow a crystal. After the temperature of the furnace was dropped by 20° – 30° C (e.g., to 770° C), the boat containing the substrate and the gallium solution was taken out of the furnace to stop the growth of the crystal.

Figure 3:
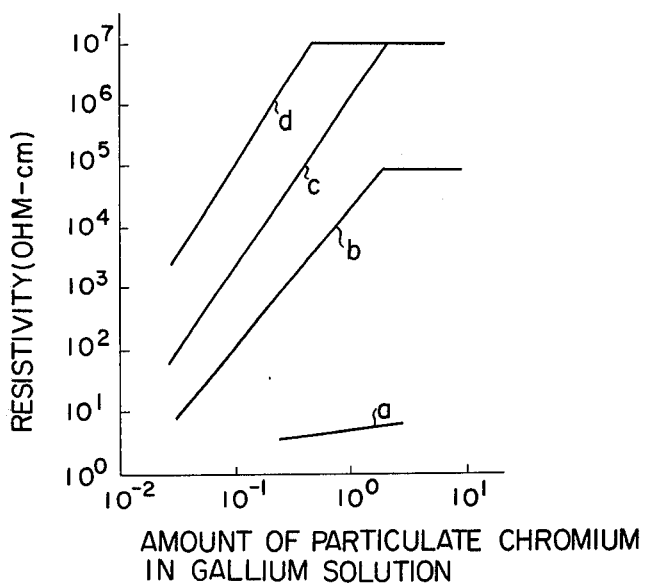
FIG. 3 is a graph of test results substantiating the efficiency of the present invention.

FIG. 3 shows a relationship among (i) resistivity, (ii) residual free electron concentration and (iii) the amount of chromium added to the gallium solution with regard to an epitaxial crystal grown at a starting temperature of 800° C. Curve (a) in FIG. 3 shows the relationship between the resistivity and the amount of chromium with regard to a crystal grown under such conditions that a crystal having a residual free electron concentration of $1 \times 10^{15}$ cm$^{-3}$ would be grown if the crystal growth were carried out without the addition of chromium. Curves b, c and d similarly show the relationships between the resistivity and the amount of chromium with regard to crystals grown under such conditions that crystals having residual free electron concentrations of $1 \times 10^{14}$ cm$^{-3}$, $3 \times 10^{13}$ cm$^{-3}$ and $5 \times 10^{12}$ cm$^{-3}$ respectively would be grown if the growing of the crystals were carried out without the addition of chromium.

As can be seen from this figure, it is clear that the resistivity of an epitaxial crystal increases as the amount of chromium added increases. However, with regard to crystals represented by Curve a (i.e., crystals grown under such conditions that a crystal having a residual free electron concentration of $1 \times 10^{15}$ cm$^{-3}$ would be grown without the addition of chromium), a semi-insulating crystal having a high resistivity could not be produced even when the amount of chromium was increased. Furthermore, with regard to crystals expressed by Curve b (i.e., crystals grown under such conditions that a crystal having a residual free electron concentration of $1 \times 10^{14}$ cm$^{-3}$ would be grown without the addition of chromium), the crystals produced had a resistivity of $10^5$ ohm-cm at best. In view of the test results shown in FIG. 3, it can be understood that in order to produce a semi-insulating epitaxial crystal having as high a resistivity as a bulk crystal resistivity ($10^6 - 10^8$ ohm-cm), e.g., up to $3 \times 10^7$ ohm-cm, the growing of the crystal must be conducted under such conditions that a crystal having a residual free electron concentration of not more than $3 \times 10^{13}$ cm$^{-3}$ would be grown if the growing of the crystal were carried out without the addition of chromium. If the growing of a crystal is conducted under such conditions as to produce a crystal having a residual free electron concentration of less than the above value, the amount of chromium to be added to the gallium solution may be decreased and a semi-insulating gallium arsenide epitaxial crystal having a higher quality can be obtained.

The residual free electron concentration of the crystal grown can be adjusted by controlling the heating of the gallium solution in an atmosphere of hydrogen and the arsenic vapor pressure in the reaction tube during epitaxially growing.

A crystal grown at a temperature of higher than 830° C often becomes a p-type crystal. Under such conditions as to produce a p-type crystal, the addition of chromium is not effective in the production of a semi-insulating crystal. Thus, in order to obtain an n-type crystal, the resitivity of which is effectively increased by the addition of chromium, the growing of the crystal must be conducted at a temperature of lower than 830° C. However, we have found that such a p-type crystal can be converted into an n-type crystal having a high resistivity by the addition of a suitable amount of tin (Sn).

Figure 4:
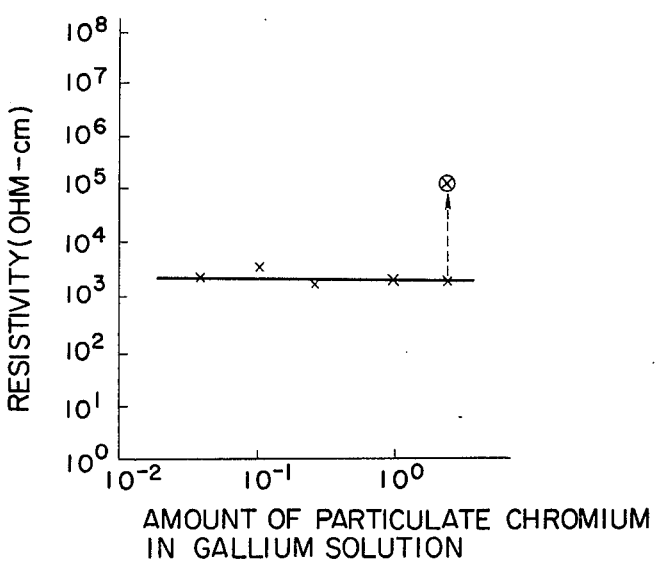
FIG. 4 is a graph to show the effect of the addition of Sn.

FIG. 4 shows the effect of the addition of Sn on the increase of resistivity. In this test, a crystal was grown at a starting temperature of 850° C. Generally, at such a high temperature of more than 850° C, a p-type crystal having a carrier (residual free hole) concentration of about $1 \times 10^{13}$ cm$^{-3}$ is produced. Under such conditions, as can be seen from FIG. 4, the addition of chromium did not contribute to an increase of resistivity. However, such a p-type crystal could be converted to an n-type crystal having a resistivity of two figures higher than that of the crystal to be grown without the addition of Sn when about 0.01 mol % of Sn was added to a gallium arsenide solution containing about 1 mol % of chromium. In FIG. 4, (X) indicates the resistivity of the crystal grown with the addition of Sn.

An amount of Sn to be added is generally calculated in accordance with the following equation.

$$X_{Sn} = 5.43 \times 10^{-15} \times P \text{ (mg)}$$

wherein $X_{Sn}$ represents an amount of Sn used, and P represents the residual free hole concentration (cm$^{-3}$).

EXAMPLE 2

A solution containing 7 g of gallium (Ga), 875 mg of gallium arsenide (GaAs), 700 μg of tin (Sn) and 20 mg of chromium (Cr) was charged into an apparatus as shown in FIG. 2 to grow a crystal at 900° C, and consequently a crystal having a resistivity of $5 \times 10^7$ ohm-cm was obtained.

Hereinbefore, although we have described the preferred embodiments of the method for producing chromium doped III–V compound semiconductors taking gallium arsenide (m.p. 1,238° C) as an example, the method of the present invention can of course be applied, in the same manner as above, to the production of other III–V compound semiconductors such as gallium phosphide (m.p. 1,467° C), indium phosphide (m.p. 1,070° C), gallium-aluminum-arsenide (melting point varies with the content of Al, for example, m.p. of 96.5/1.0/2.5 gallium-aluminum-arsenide 898° C; m.p. of 84.0/1.0/15.0 gallium-aluminum-arsenide 1,082° C; and m.p. of 85.0/5.0/10.0 gallium-aluminum-arsenide 1,140° C) or other mixed crystals.

The method of the present invention can also be used to separate one element from another, and is considered to be an important technique in connection with the development of planarizing and integrating techniques.

What we claim is:

1. A method for growing semi-insulating Group III–V compound semiconductor crystals having a residual free electron concentration of $10^{13}$ cm$^{-3}$ or less, on a substrate by means of an epitaxially crystallizing process in a liquid state, which comprises the steps of:
   a. placing a boat containing a saturated solution of a III–V compound having chromium added therein in an inclined reaction tube;
   b. heating the solution at a temperature of 800° – 950° C in an atmosphere of hydrogen;
   c. cooling the reaction tube to room temperature and placing a substrate in said boat without permitting the substrate to come into contact with the solution, while another boat having a V Group element vapor-generating solution thereon is inserted in said reaction tube;
   d. heating the reaction tube at a temperature of 700° to 900° C, and bringing the saturated solution of III–V compound into contact with the substrate by reversing the inclination of the reaction tube; and
   e. slowly cooling the system to grow a crystal of the III–V compound on the substrate at a temperature of 700° – 830° C.

2. The method for growing semi-insulating III–V compound semiconductor crystals according to claim 1, whereby in step (a) tin is added to the saturated solution of III–V compound and in step (e) a crystal of III–V compound is grown at a temperature of 830° – 900° C.

3. The method for growing semi-insulating III–V compound semiconductor crystals according to claim 2, wherein the III–V compound is selected from the group consisting of gallium arsenide, gallium phosphide, indium phosphide and gallium-aluminum-arsenide.

4. The method for growing semi-insulating III–V compound semiconductor crystals according to claim 2, wherein step (a) gallium solution saturated with gallium arsenide having chromium and tin added therein is used as the saturated solution of III–V compound, and in step (c) gallium solution-containing arsenide is used as the V group element vapor-generating solution.

5. The method for growing semi-insulating III–V compound semiconductor crystals according to claim 1, wherein the III–V compound is selected from the group consisting of gallium arsenide, gallium phosphide, indium phosphide, and gallium-aluminum-arsenide.

6. The method for growing semi-insulating III–V compound semiconductor crystals according to claim 1, wherein step (a) gallium solution saturated with gallium arsenide having chromium added therein is used as the saturated solution of III–V compound, and in step (c) gallium solution containing arsenide is used as the V group element vapor-generating solution.

* * * * *